(12) United States Patent
Watanabe

(10) Patent No.: US 9,728,684 B2
(45) Date of Patent: Aug. 8, 2017

(54) LIGHT EMITTING APPARATUS WITH RECESSED REFLECTIVE RESIN AND PROTRUDING REFLECTION FRAME

(71) Applicants: CITIZEN ELECTRONICS CO., LTD., Yamanashi (JP); CITIZEN WATCH CO., LTD., Tokyo (JP)

(72) Inventor: Yusuke Watanabe, Shizuoka (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 121 days.

(21) Appl. No.: 14/645,002

(22) Filed: Mar. 11, 2015

(65) Prior Publication Data

US 2015/0263239 A1 Sep. 17, 2015

(30) Foreign Application Priority Data

Mar. 14, 2014 (JP) ................................. 2014-051040
Mar. 14, 2014 (JP) ................................. 2014-052117

(51) Int. Cl.
*H01L 33/60* (2010.01)
*H01L 33/48* (2010.01)
(Continued)

(52) U.S. Cl.
CPC .............. *H01L 33/486* (2013.01); *F21K 9/62* (2016.08); *F21K 9/64* (2016.08); *F21V 13/14* (2013.01);
(Continued)

(58) Field of Classification Search
CPC ... H01L 33/486; H01L 33/504; H01L 33/505; H01L 33/507; H01L 33/58; H01L 33/60;
(Continued)

(56) References Cited

U.S. PATENT DOCUMENTS

| 6,573,653 B1* | 6/2003 | Ishinaga | H01L 25/0753 257/E25.02 |
| 2001/0042865 A1* | 11/2001 | Oshio | H01L 33/486 257/100 |
| 2004/0201987 A1* | 10/2004 | Omata | H01L 33/486 362/230 |
| 2008/0265266 A1 | 10/2008 | Bogner et al. | |
| 2009/0296367 A1 | 12/2009 | Sekine et al. | |
| 2010/0264438 A1 | 10/2010 | Suenaga | |
| 2013/0207145 A1* | 8/2013 | Schneider | H01L 33/60 257/98 |

(Continued)

FOREIGN PATENT DOCUMENTS

| JP | 2009-283988 A | 12/2009 | |
| KR | WO 2013073897 A2 * | 5/2013 | ........... H01L 33/486 |

OTHER PUBLICATIONS

European Patent Office, Extended European Search Report for EP Patent Application No. 15157736.8, Jul. 14, 2015.

*Primary Examiner* — Anh Mai
*Assistant Examiner* — Steven Horikoshi

(57) ABSTRACT

Provided is a light emitting apparatus that causes no lateral light leakage, enables easy assembly, and allows free selection of the shape of a reflection frame. The light emitting apparatus includes an LED device which is flip-chip mounted on a substrate, a phosphor layer placed on a light emitting surface of the LED device, a reflective resin having a recessed portion formed on the upper surface thereof, the reflective resin covering the side surface of the LED device and the side surface of the phosphor layer, and a reflection frame having a protruded portion formed on the lower surface thereof, the reflection frame being fixed on or above the phosphor layer and the reflective resin by engaging the protruded portion with the recessed portion of the reflective resin.

10 Claims, 18 Drawing Sheets

(51) Int. Cl.
*F21V 13/14* (2006.01)
*H01L 33/54* (2010.01)
*H01L 33/62* (2010.01)
*F21K 9/62* (2016.01)
*F21K 9/64* (2016.01)
*H01L 33/50* (2010.01)
*F21Y 115/10* (2016.01)

(52) U.S. Cl.
CPC ............ *H01L 33/507* (2013.01); *H01L 33/54* (2013.01); *H01L 33/62* (2013.01); *F21Y 2115/10* (2016.08); *H01L 33/505* (2013.01); *H01L 33/60* (2013.01); *H01L 2224/16225* (2013.01); *H01L 2924/181* (2013.01); *H01L 2933/005* (2013.01); *H01L 2933/0033* (2013.01)

(58) Field of Classification Search
CPC . F21K 9/62; F21K 9/232; F21K 9/233; F21K 9/68; F21V 17/005; F21V 17/06; F21V 17/14
See application file for complete search history.

(56) References Cited

U.S. PATENT DOCUMENTS

| | | | |
|---|---|---|---|
| 2013/0307004 A1 | 11/2013 | Weidner et al. | |
| 2014/0042482 A1* | 2/2014 | Kim | H01L 33/58 257/99 |
| 2014/0070255 A1 | 3/2014 | Inoue et al. | |
| 2014/0328083 A1* | 11/2014 | Oh | H01L 33/486 362/612 |

* cited by examiner

LIGHT EMITTING APPARATUS WITH RECESSED REFLECTIVE RESIN AND PROTRUDING REFLECTION FRAME

CROSS REFERENCE TO RELATED APPLICATIONS

This application is a new U.S. patent application that claims benefit of JP 2014-051040, filed on Mar. 14, 2014, and JP 2014-052117, filed on Mar. 14, 2014. The entire contents of JP 2014-051040 and JP 2014-052117 are hereby incorporated by reference.

BACKGROUND

Technical Field

The present invention relates to a light emitting apparatus with a light emitting diode (LED) device as a light emitting source.

Related Art

Since an LED device is a semiconductor device, it has a longer operating life and superior operating characteristics, is small-sized, has high light emission efficiency, and exhibits a bright luminescent color. As the results, an LED device has been widely used recently as a backlight for a color display apparatus, a flashlight apparatus, an illumination, or the like.

Among others, a reflection-frame-type light emitting apparatus has recently been proposed, in which the surroundings of an LED device are covered with a reflective resin such as a white resin for improving the upward light emission efficiency by reflecting upward the light emitted laterally by the LED device, and a reflection frame having an aperture is combined above the LED device for condensing further the light upward.

As an example, a reflection-frame-type light emitting apparatus described in JP2009-283988A will be described below. For easier understanding, drawings have been simplified to the extent that the spirit of the invention is not jeopardized, and the names of parts have been changed to conform to those used in the present specification.

FIG. 28 is a cross-sectional view of a light emitting apparatus 100 described in JP2009-283988A. The light emitting apparatus 100 has a circuit substrate 107, which has wiring electrodes 105a and 105b on the upper side, side electrodes 105c, and power electrodes 105d on the back side. The wiring electrodes 105a and 105b are connected through the side electrodes 105c with the power electrodes 105d. On the upper surface of the circuit substrate 107, an LED device 101 is die-bonded to the wiring electrode 105a, and an upper electrode of the LED device 101 is connected through a wire 104 with the wiring electrode 105b. The LED device 101 and the wire 104 are covered with a translucent encapsulation resin 103 (a transparent resin or a fluorescent resin). Further, a reflection frame (reflector) 109 for reflecting and collecting the emitted light from the LED device 101 is fixed by adhesion or the like, around a mounting area of the LED device 101 on the circuit substrate 107.

FIG. 29 is a cross-sectional view of another light emitting apparatus 200. In the light emitting apparatus 200, an LED device 201 is flip-chip mounted at the center of a circuit substrate 207 having wiring electrodes 205a and 205b. A reflection frame 209 (a horn reflector), which is made of a reflective white resin or the like and opens wider upward, is fixed around the LED device 201. Further, the surroundings of the reflection frame 209 is sealed with an encapsulation resin 206 composed of a black color resin or the like, and a phosphor layer 202 and a lens 233 are fixed at an aperture of the reflection frame 209 by the encapsulation resin 206. The central axis of the lens 233 and the central axis of the LED device 201 are aligned in the light emitting apparatus 200, and therefore the light emitted vertically upward from the LED device 201 and the light emitted laterally from the LED device 201 and reflected upward by a reflection surface of the reflection frame 209 are collected favorably by the lens 233 and emitted upward.

SUMMARY

In the light emitting apparatus 100 and 200, a reflection frame is directly fixed on a circuit substrate having concave-convex shape due to a wiring electrode or the like, by a method such as adhesion. As the results, the production man-hour becomes high, and gaps may be generated below the reflection frame due to the concave-convex shape formed by a wiring electrode or the like, on the circuit substrate. The gaps cause light leakage of light emitted laterally from the LED device through the gaps, or emitted light reflected at a bottom surface of the reflection frame may be disordered, so that light may be emitted without being collected adequately by the reflection frame.

Under such circumstances, an object of the present invention is to provide a light emitting apparatus that causes no lateral light leakage, enables easy assembly, and allows free selection of the shape of a reflection frame.

Provided is a light emitting apparatus including an LED device which is flip-chip mounted on a substrate, a phosphor layer placed on a light emitting surface of the LED device, a reflective resin having a recessed portion formed on the upper surface thereof, the reflective resin covering the side surface of the LED device and the side surface of the phosphor layer, and a reflection frame having a protruded portion formed on the lower surface thereof, the reflection frame being fixed on or above the phosphor layer and the reflective resin by engaging the protruded portion with the recessed portion of the reflective resin.

Preferably, in the above light emitting apparatus, the reflection frame includes a round opening provided above the phosphor layer and a curved reflection surface provided in the opening.

Preferably, the above light emitting apparatus further includes a diffusing resin layer being layered on the upper surfaces of the phosphor layer and the reflective resin, the diffusing resin layer having a through-hole at a position corresponding to the recessed portion of the reflective resin, wherein the protruded portion of the reflection frame passes through the through-hole of the diffusing resin layer and engages with the recessed portion of the reflective resin.

Preferably, in the above light emitting apparatus, the reflective resin has a recessed step formed at the side circumference thereof as the recessed portion, and the reflection frame has a protruded step formed at the side circumference thereof as the protruded portion.

Preferably, in the above light emitting apparatus, the reflection frame has an entry aperture into which light from the LED device enters through the phosphor layer, and the upper surface of the phosphor layer is larger than the entry aperture of the reflection frame.

Preferably, in the above light emitting apparatus, the entry aperture of the reflection frame is round, and the phosphor layer has a rectangular upper surface and corners covered by the reflection frame.

Preferably, in the above light emitting apparatus, the entry aperture of the reflection frame is rectangular with rounded corners, and the phosphor layer has a rectangular upper surface and corners covered by the reflection frame.

Preferably, in the above light emitting apparatus, the reflection frame has an entry aperture into which light from the LED device enters through the phosphor layer, and the phosphor layer has an upper surface whose shape and size are nearly identical with the shape and size of the entry aperture of the reflection frame.

Preferably, in the above light emitting apparatus, the upper surface of the phosphor layer and the entry aperture of the reflection frame are both round or both rectangular.

Preferably, in the above light emitting apparatus, the reflection frame has an entry aperture into which light from the LED device enters through the phosphor layer, and an exit aperture at a position opposing to the entry aperture, and the light emitting apparatus further includes a lens placed so as to cover the exit aperture of the reflection frame.

Also provided is a light emitting apparatus including an LED device which is flip-chip mounted on a substrate, a phosphor layer placed on a light emitting surface of the LED device, a reflective resin covering the side surface of the LED device and the side surface of the phosphor layer, and a reflection frame having an entry aperture on the upper side of the phosphor layer and an exit aperture on the emitting side, wherein a recessed step is formed at the side circumference of the reflective resin, a protruded step is formed at the side circumference of the reflection frame, and the reflection frame is positioned and fixed on the reflective resin by engaging the protruded step of the reflection frame with the recessed step of the reflective resin.

The above light emitting apparatus causes no lateral light leakage, enables easy assembly, and allows free selection of the shape of a reflection frame.

BRIEF DESCRIPTION OF THE DRAWINGS

Other features and advantages of the present light emitting apparatus will be apparent from the ensuing description, taken in conjunction with the accompanying drawings, in which:

FIGS. 25A to 25D are top views depicting production steps of the light emitting apparatus 70;

DETAILED DESCRIPTION

Hereinafter, with reference to the drawings, exemplary embodiments of the light emitting apparatus will be described. It should be noted that the technical scope of the present invention is not limited to the following embodiments, but covers the invention described in the claims and its equivalent. In the explanation of the drawings, the same symbols are attached to the same or corresponding elements, and duplicated explanation is omitted. The scale of members is appropriately changed for explanation.

Figure 1:
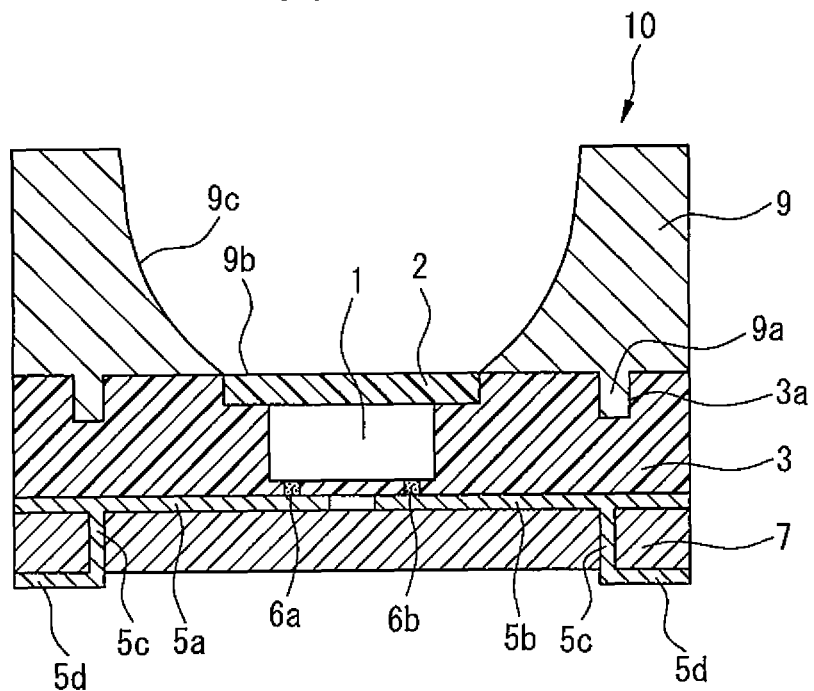
FIGS. 1 and 2 are respectively a cross-sectional view and a top view of a light emitting apparatus 10.
Figure 2:
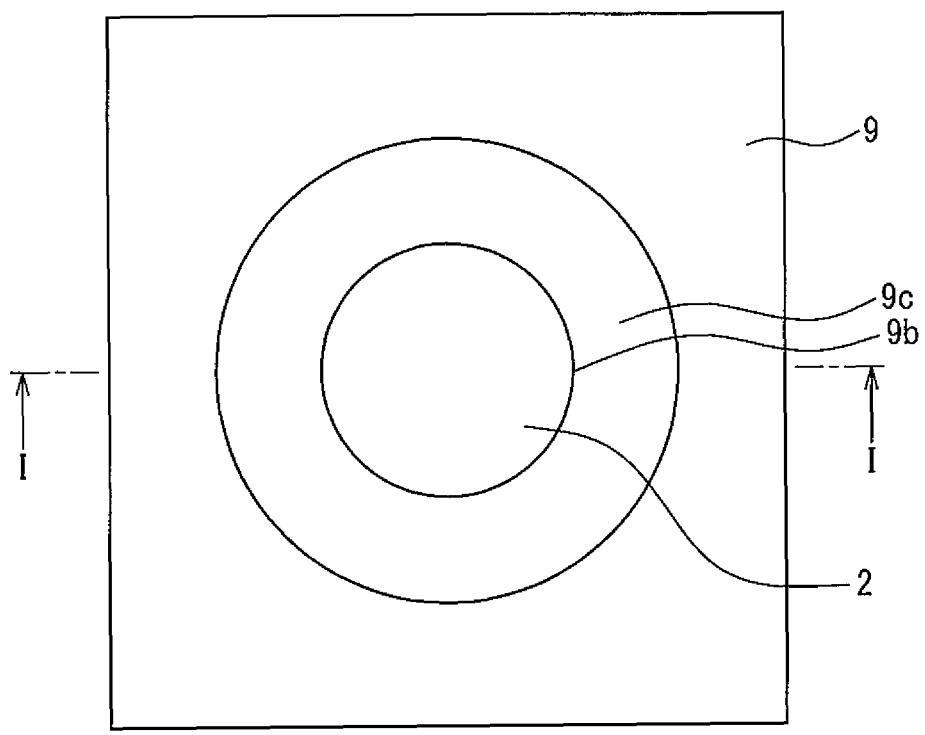

FIGS. 1 and 2 are respectively a cross-sectional view and a top view of a light emitting apparatus 10. FIG. 1 depicts a cross-section along the line I-I in FIG. 2. As depicted in FIG. 1, the light emitting apparatus 10 includes a circuit substrate 7. Wiring electrodes 5a and 5b are provided on the upper side of the circuit substrate 7, and power electrodes 5d are provided on the back side of the circuit substrate 7. On the wiring electrodes 5a and 5b, an LED device 1 is flip-chip mounted by electroconductive components 6a and 6b, and the wiring electrodes 5a and 5b are connected with the power electrodes 5d through through-hole electrodes 5c. On the light emitting surface of the LED device 1, a disk-shaped phosphor layer 2 having a size slightly larger than the light emitting surface of the LED device 1 is placed, and fixed to the LED device 1 by adhesion using a transparent adhesive, or the like.

Further, on the circuit substrate 7, the side surface of the LED device 1 and the side surface of the phosphor layer 2 are sealed by filling a reflective resin 3, and a reflection frame 9 is provided on the top of the reflective resin 3. At the upper surface of the reflective resin 3, a recessed portion 3a is formed, and at the lower surface of the reflection frame 9, a protruded portion 9a is formed. The reflective resin 3 and the reflection frame 9 are fixed together by engagement of the protruded portion 9a with the recessed portion 3a.

As depicted in FIG. 2, an aperture 9b is provided at the central position of the reflection frame 9, i.e., above the phosphor layer 2, and the phosphor layer 2 is exposed in the aperture 9b. Further, a curved reflection surface 9c, which broadens upward from the aperture 9b, is formed on the reflection frame 9.

The reflective resin 3 and the reflection frame 9 have a function to increase emitting efficiency by reflecting the emitted light from the LED device 1 upward above the LED device 1. For a reflective resin 3 and a reflection frame 9, for example, a material is used in which a coating material, such as a silicone resin, an epoxy resin, and an acrylic resin, is mixed with a particle, such as titanium oxide, silicon dioxide, zirconium dioxide, alumina, and boron nitride, as a reflective filler. The reflective resin 3 and the reflection frame 9 are formed, for example, by resin molding, and a dropping apparatus or an injection apparatus is used for filling a resin.

Figure 3:
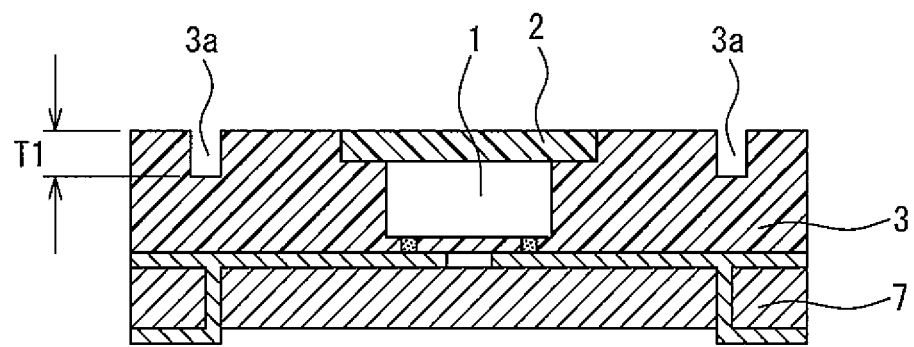
FIGS. 3 and 4 are respectively a cross-sectional view and a top view of the light emitting apparatus 10, from which the reflection frame 9 is removed.
Figure 4:
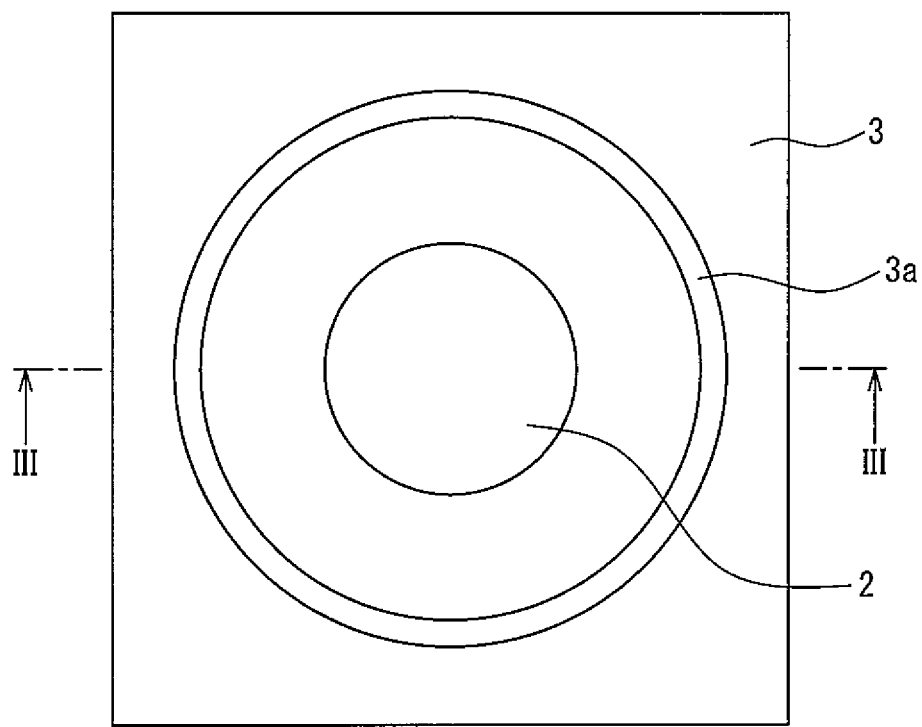

FIGS. 3 and 4 are respectively a cross-sectional view and a top view of the light emitting apparatus 10, from which the reflection frame 9 is removed. FIG. 3 depicts a cross-section along the line III-III in FIG. 4. The recessed portion 3a is formed to a ring, which is a circle concentric with the phosphor layer 2 as depicted in FIG. 4, and the depth thereof is T1 as depicted in FIG. 3.

Figure 5:
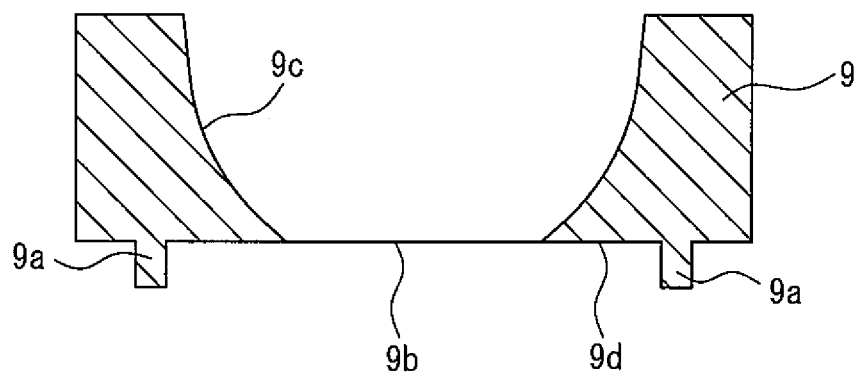
FIGS. 5 and 6 are respectively a cross-sectional view and a top view of the reflection frame 9.
Figure 6:
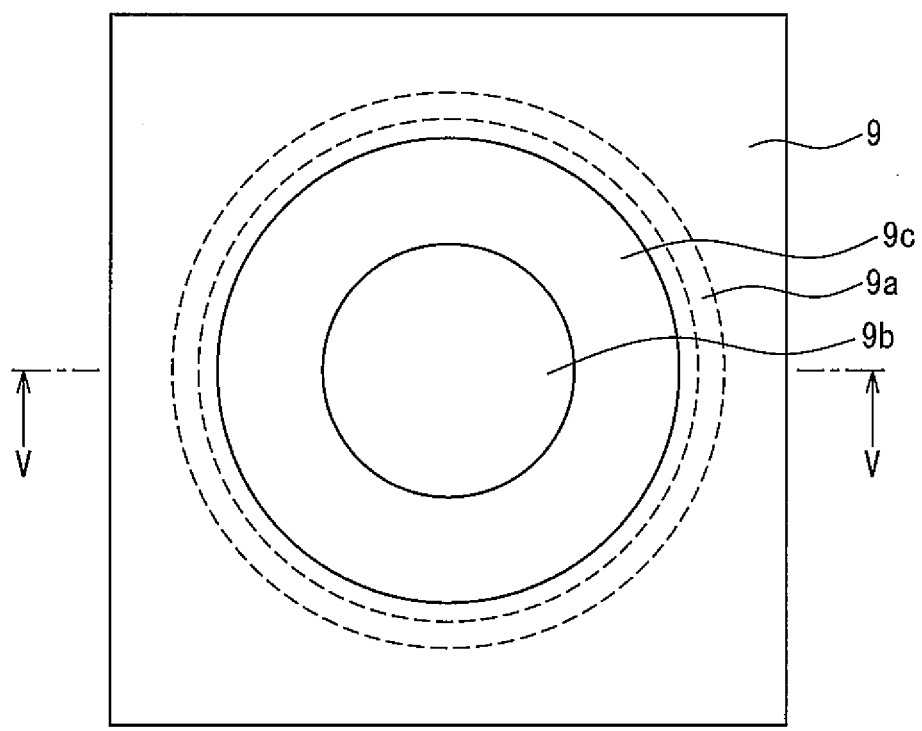

FIGS. 5 and 6 are respectively a cross-sectional view and a top view of the reflection frame 9. FIG. 5 depicts a cross-section along the line V-V in FIG. 6. The position of the protruded portion 9a is depicted as a dashed line in FIG. 6. The protruded portion 9a is formed on the lower surface 9d of the reflection frame 9 at a position corresponding to the recessed portion 3a of the reflective resin 3 in a round (ring) form congruent with the recessed portion 3a. In this connection, the shapes of the aperture 9b, the protruded portion 9a, and the recessed portion 3a are not restricted to a round shape, and may be a polygonal such as a rectangular, or another shape such as an elliptical shape.

Figure 7A:
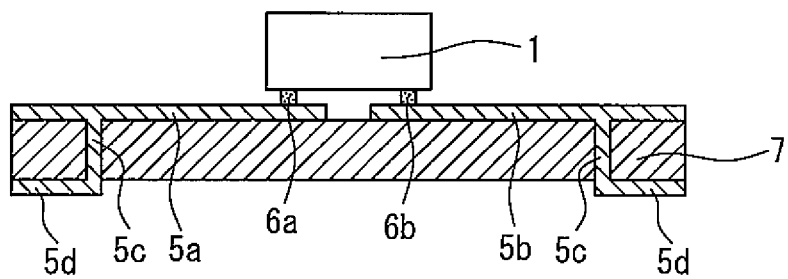
FIGS. 7A to 7D are cross-sectional views depicting production steps of the light emitting apparatus 10.
Figure 7B:
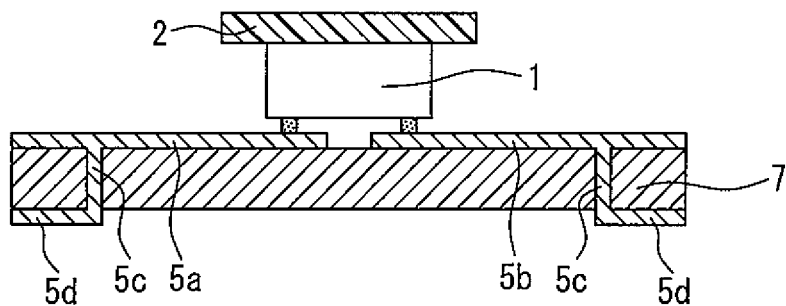
Figure 7C:
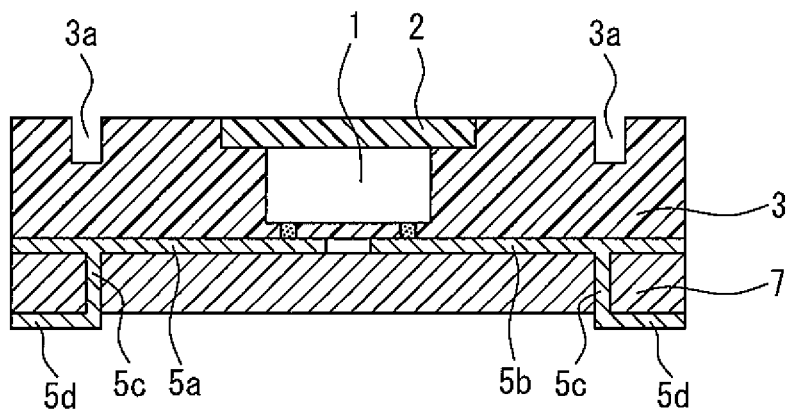
Figure 7D:
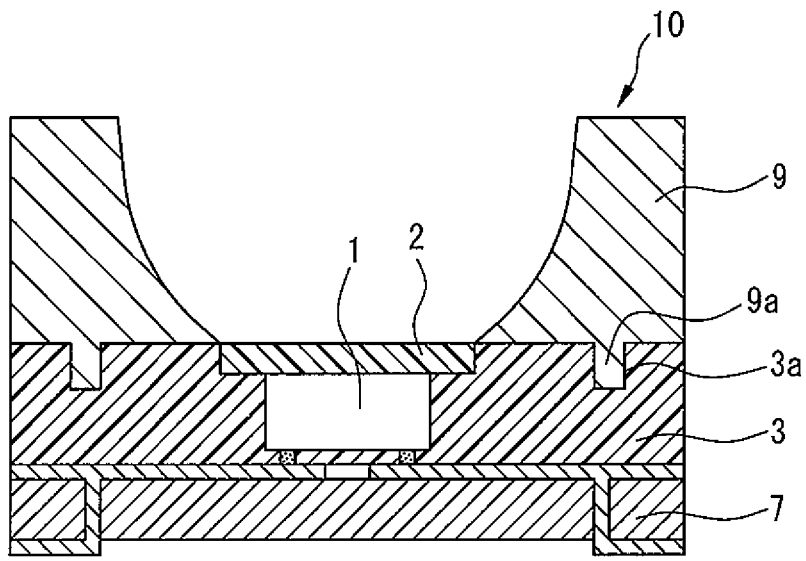

FIGS. 7A to 7D are cross-sectional views depicting production steps of the light emitting apparatus 10. First, as depicted in FIG. 7A, the LED device 1 is flip-chip mounted on the upper surface of the circuit substrate 7. Next, as depicted in FIG. 7B, the phosphor layer 2 is bonded onto the light emitting surface of the LED device 1. Then, as depicted in FIG. 7C, the side surface of the LED device 1 and the side surface of the phosphor layer 2 are sealed by filling the reflective resin 3. The recessed portion 3a is formed on the upper surface of the reflective resin 3, for example, by an injection mold when the reflective resin 3 is injected. Alternatively, the reflective resin 3 may be cast to a planar form and the recessed portion 3a may be formed on the upper surface thereof by cutting or the like. Then, as depicted in FIG. 7D, the protruded portion 9a of the reflection frame 9 is inserted into the recessed portion 3a of the reflective resin 3. Through the above process steps, the light emitting apparatus 10 is completed.

The reflective resin 3 and the reflection frame 9 may be fixed together by simply press-fitting the protruded portion 9a of the reflection frame 9 into the recessed portion 3a of the reflective resin 3, or additionally by bonding with a small amount of an adhesive.

Figure 28:
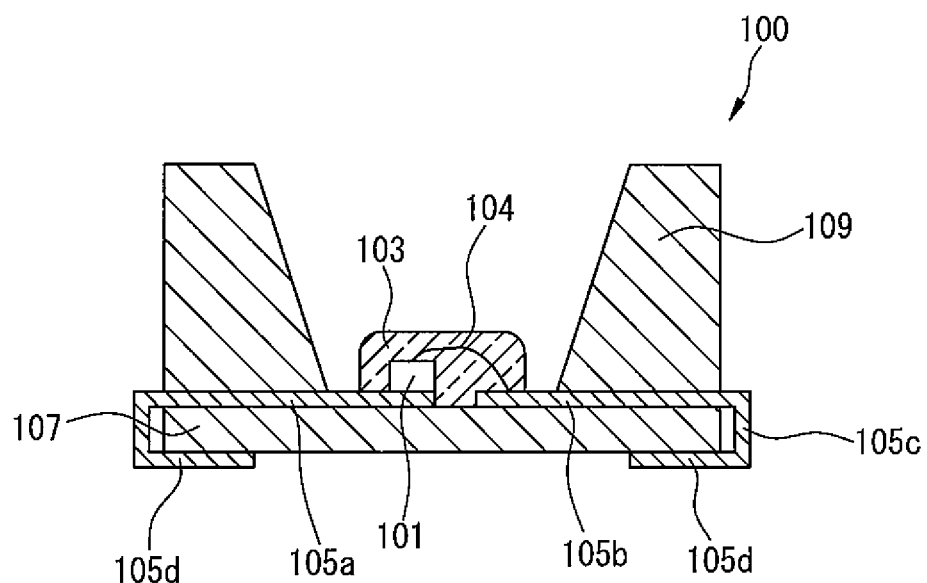
FIG. 28 is a cross-sectional view of a light emitting apparatus 100.
Figure 29:
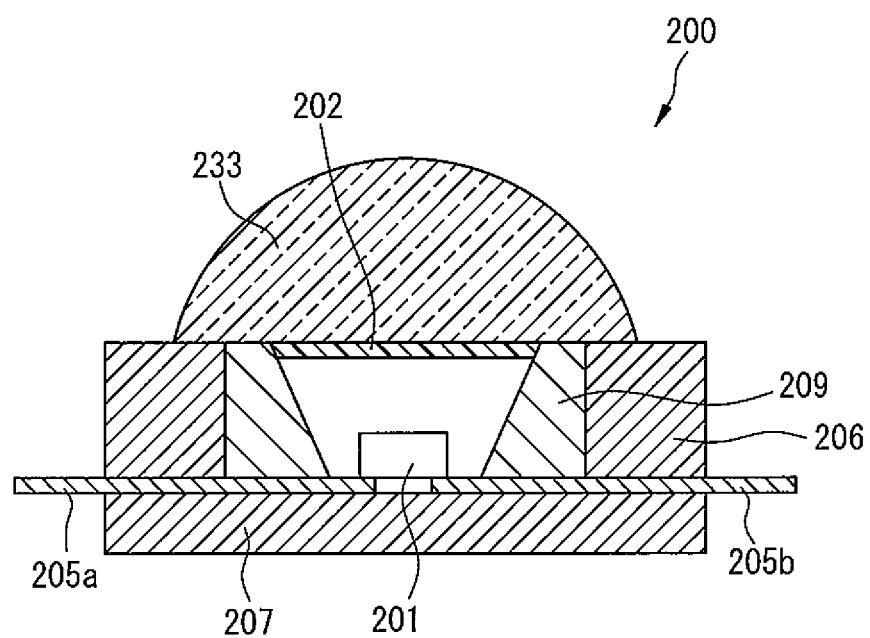
FIG. 29 is a cross-sectional view of a light emitting apparatus 200.

Next, the operation of the light emitting apparatus 10 will be described. When a drive voltage is applied to the power electrodes 5d provided at the back side of the circuit substrate 7, the LED device 1 emits blue light. The blue light and yellow light generated by the phosphor layer 2 excited by the blue light are mixed to emit white light. The blue light emitted from the LED device 1 and the yellow light generated by excitation of the phosphor layer 2 are emitted totally upward due to the presence of the reflective resin 3, and condensed by the reflection surface 9c of the reflection frame 9. As the result, light superior in directivity is emitted from the light emitting apparatus 10. In the light emitting apparatus 100 and 200 depicted in FIGS. 28 and 29, light may leak laterally through gaps to be generated at a bonded surface between the circuit substrate and the reflection frame. On the other hand, in the case of the light emitting apparatus 10, since the recessed portion 3a and the protruded portion 9a are provided at the bonded surface between the reflective resin 3 and the reflection frame 9 and fixed together by engagement thereof, no light leakage through gaps at the bonded surface can take place.

Figure 8:
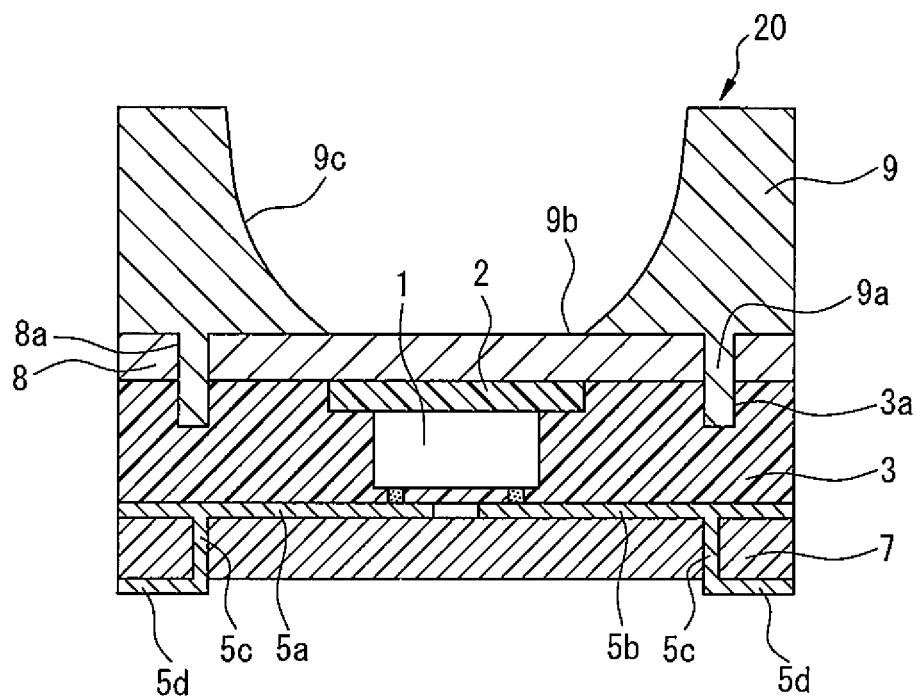
FIGS. 8 and 9 are respectively a cross-sectional view and a top view of a light emitting apparatus 20.
Figure 9:
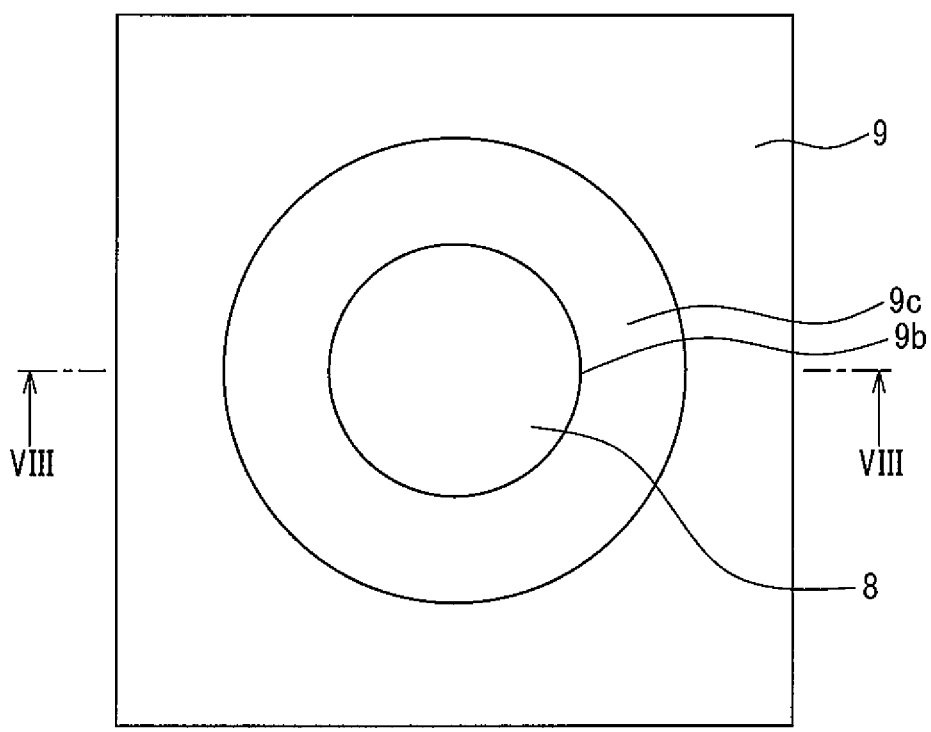

FIGS. 8 and 9 are respectively a cross-sectional view and a top view of a light emitting apparatus 20. FIG. 8 depicts a cross-section along the line VIII-VIII in FIG. 9. The basic constitution of the light emitting apparatus 20 is the same as the light emitting apparatus 10 depicted in FIGS. 1 and 2. As for difference between the light emitting apparatus 10 and the light emitting apparatus 20, while in the light emitting apparatus 10 the reflection frame 9 is directly fixed on the reflective resin 3, in the light emitting apparatus 20 the reflection frame 9 is fixed above the phosphor layer 2 and the reflective resin 3 with a diffusing resin layer 8 (hereinafter abbreviated as "diffusion plate 8") interposed therebetween.

As depicted in FIG. 8, the light emitting apparatus 20 has a diffusion plate 8 layered on the upper surfaces of the phosphor layer 2 and the reflective resin 3, and a through-hole 8a with the same shape as the recessed portion 3a of the reflective resin 3 is provided in the diffusion plate 8 at a position corresponding to the recessed portion 3a. Then, the protruded portion 9a of the reflection frame 9 is inserted (engaged) in the recessed portion 3a through the through-hole 8a to be fixed. Therefore, the height of the protruded portion 9a of the reflection frame 9 is equal to the sum of the depth of the through-hole 8a of the diffusion plate 8 and the depth of the recessed portion 3a of the reflective resin 3. Further, as depicted in FIG. 9, in the light emitting apparatus 20, the diffusion plate 8 is exposed in the aperture 9b provided at the central position of the reflection frame 9.

Figure 10C:
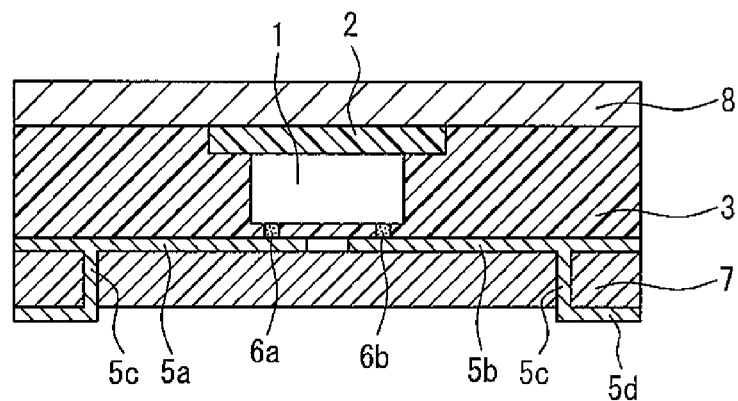
FIGS. 10C to 10E are cross-sectional views depicting production steps of the light emitting apparatus 20.
Figure 10D:
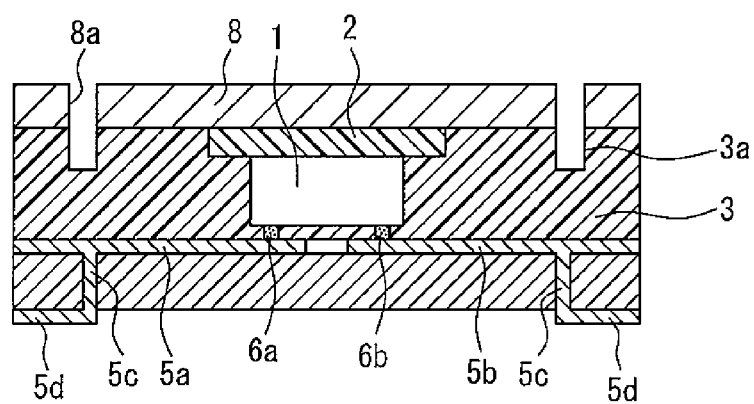
Figure 10E:
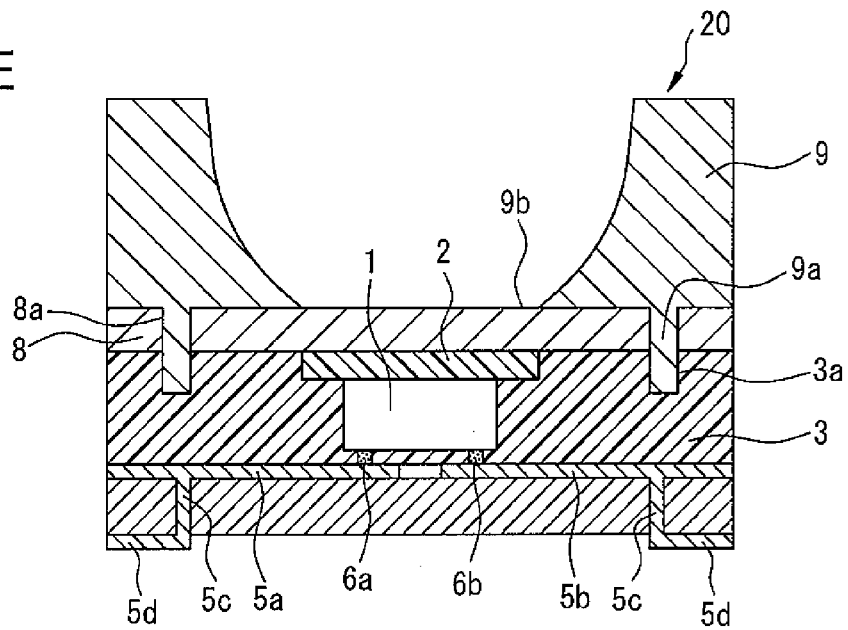

FIGS. 10C to 10E are cross-sectional views depicting production steps of the light emitting apparatus 20. Since the steps of mounting the LED device 1 on the circuit substrate 7 and bonding the phosphor layer 2 thereto are identical with FIGS. 7A and 7B, illustrations thereof are omitted. In the case of the light emitting apparatus 20, the diffusion plate 8 is placed thereafter on the upper surfaces of the phosphor layer 2 and the reflective resin 3 as depicted in FIG. 10C. Then, the through-hole 8a of the diffusion plate 8 and the recessed portion 3a of the reflective resin 3 are formed at the same horizontal position as depicted in FIG. 10D, for example, by cutting. Then, as depicted in FIG. 10E, the protruded portion 9a of the reflection frame 9 is inserted into the recessed portion 3a of the reflective resin 3 through the through-hole 8a of the diffusion plate 8 to complete the light emitting apparatus 20.

Next, the operation of the light emitting apparatus 20 will be described. Similarly as in the light emitting apparatus 10, when a drive voltage is applied to the power electrodes 5d, the LED device 1 emits light. In the light emitting apparatus 20, blue light from the LED device 1 and yellow light generated by excitation of the phosphor layer 2 by the blue light are mixed to white light, which is then diffused by the diffusion plate 8. As the result, even-colored light with excellent color rendering properties is condensed by the reflection frame 9, and emitted from the light emitting apparatus 20. Further, the light emitting apparatus 20 has a prevention effect against lateral light leakage similarly as the light emitting apparatus 10, and additionally against lateral light leakage from the diffusion plate 8 owing to the protruded portion 9a of the reflection frame 9.

In light emitting apparatus described below referring to FIG. 11 to FIG. 27, a diffusion plate 8 may be provided similarly as in the light emitting apparatus 20.

Figure 11:
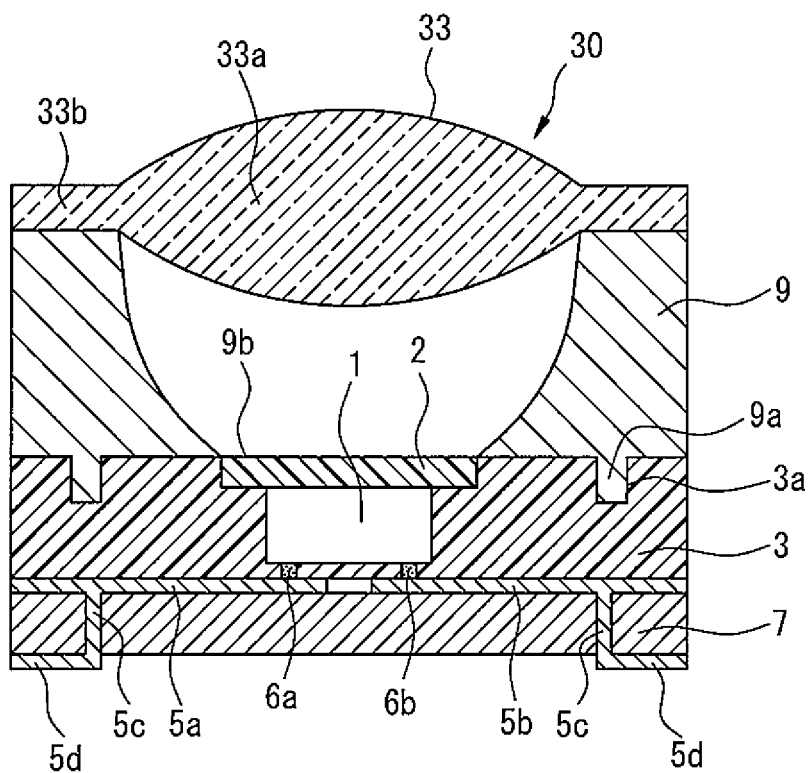
FIGS. 11 and 12 are respectively a cross-sectional view and a top view of a light emitting apparatus 30.
Figure 12:
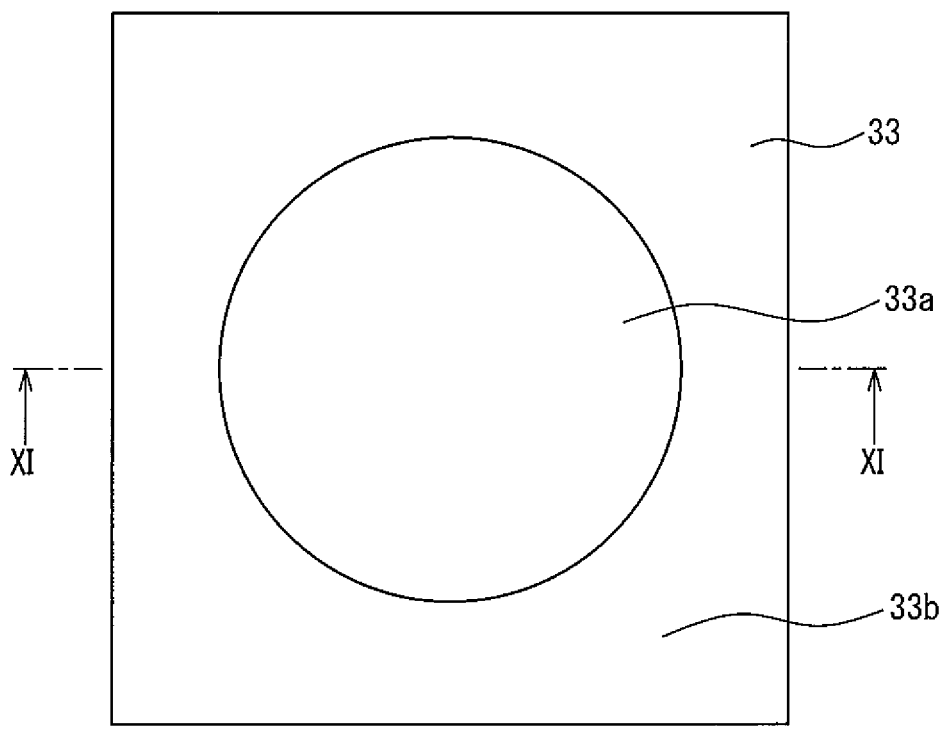

FIGS. 11 and 12 are respectively a cross-sectional view and a top view of a light emitting apparatus 30. FIG. 11 depicts a cross-section along the line XI-XI in FIG. 12. The basic constitution of the light emitting apparatus 30 is the same as the light emitting apparatus 10 depicted in FIGS. 1 and 2. However, differently from the light emitting apparatus 10, the light emitting apparatus 30 has a lens 33 placed so as to cover an upper opening of the reflection frame 9.

The lens 33 includes a round lens portion 33a (convex lens or concave lens) and a lens rim portion 33b surrounding the lens portion 33a. The lens 33 is fixed to the reflection frame 9 by fixing the lens rim portion 33b to the upper part of the reflection frame 9 with an adhesive or the like, in a state that the lens portion 33a is placed in the upper opening of the reflection frame 9.

Next, the operation of the light emitting apparatus 30 will be described. Similarly as in the light emitting apparatus 10, when a drive voltage is applied to the power electrodes 5d, the LED device 1 emits light. In the light emitting apparatus 30, blue light from the LED device 1 and yellow light generated by excitation of the phosphor layer 2 by the blue light are mixed to white light, which is then condensed by the reflection frame 9, and thereafter condensed again by the lens 33. Consequently, light well condensed and having excellent color rendering properties is emitted from the light emitting apparatus 30.

As described above, in the light emitting apparatus 10, 20 and 30, a light emitting portion is configured with the phosphor layer 2 and the diffusion plate 8 in a platy form, and the injection-molded reflective resin 3 so as to prevent lateral light leakage. Further, the light emitting apparatus 10, 20 and 30 are assembled by fitting the protruded portion 9a into the recessed portion 3a, and this allows easy production. Moreover, since the reflection frame 9 is mounted engaging the protruded portion 9a with the recessed portion 3a in the light emitting apparatus 10, 20 and 30, the reflection frame can be interchanged according to need, when reflection frames having various shapes and characteristics have been prepared with a protruded portion with a common shape and position.

Figure 13:
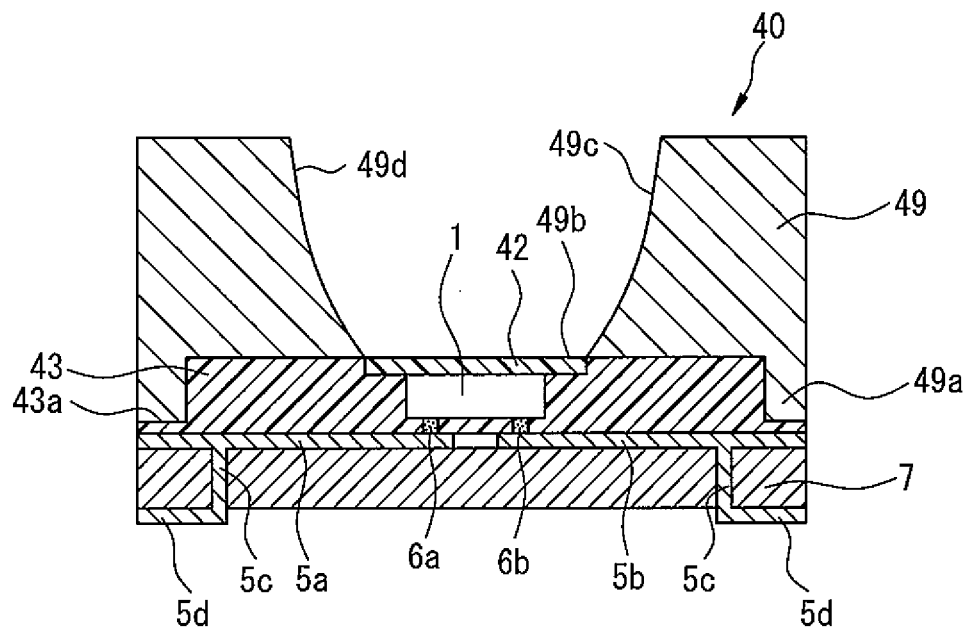
FIGS. 13 and 14 are respectively a cross-sectional view and a top view of a light emitting apparatus 40.
Figure 14:
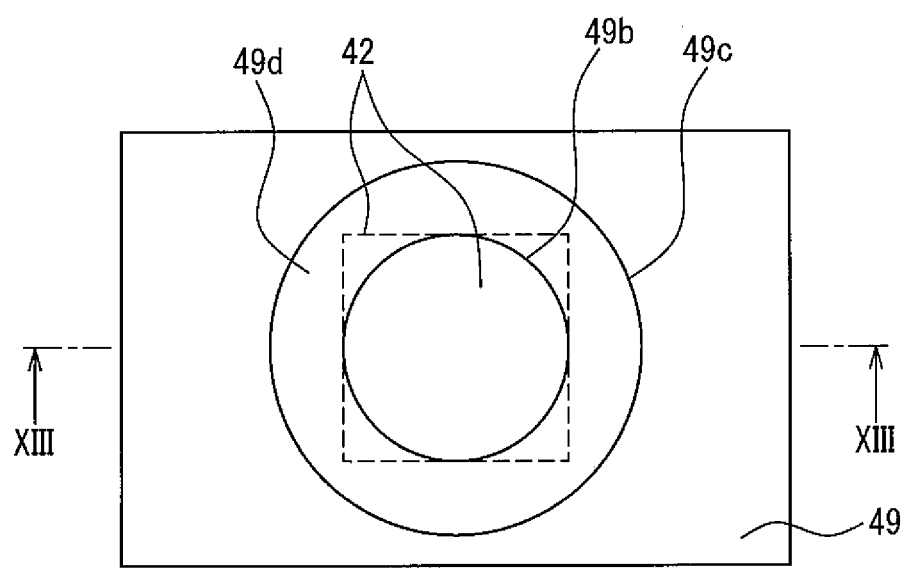

FIGS. 13 and 14 are respectively a cross-sectional view and a top view of a light emitting apparatus 40. FIG. 13 depicts a cross-section along the line XIII-XIII in FIG. 14. As depicted in FIG. 13, the light emitting apparatus 40 includes a circuit substrate 7. Wiring electrodes 5a and 5b are provided on the upper surface of the circuit substrate 7, and power electrodes 5d are provided on the back side of the circuit substrate 7. On the wiring electrodes 5a and 5b, an LED device 1 is flip-chip mounted by electroconductive components 6a and 6b, and the wiring electrodes 5a and 5b are connected with the power electrodes 5d through through-hole electrodes 5c. On the light emitting surface of the LED device 1, a rectangular phosphor layer 42 having a size slightly larger than the light emitting surface of the LED device 1 is placed, and fixed to the LED device 1 by adhesion using a transparent adhesive, or the like.

Further, on the circuit substrate 7, the side surface of the LED device 1 and the side surface of the phosphor layer 42 are sealed by filling a reflective resin 43, and a reflection frame 49 is mounted on the top of the reflective resin 43. A recessed step 43a and a protruded step 49a are respectively formed along the side circumference of the reflective resin 43, and along the side circumference of the reflection frame 49. The reflective resin 43 and the reflection frame 49 are fixed together by engaging the protruded step 49a with the recessed step 43a. The recessed step 43a and the protruded step 49a may be fixed together not only by simple engagement but also with a small amount of an adhesive.

As depicted in FIG. 14, an entry aperture 49b, through which light from the LED device 1 enters, is provided at the central position of the reflection frame 49, and the phosphor layer 42 is exposed in the entry aperture 49b. Further, the reflection frame 49 is provided with a curved reflection surface 49d, which broadens from the entry aperture 49b toward an upward exit aperture 49c. In FIG. 14, the external shape of the phosphor layer 42 is also depicted by a dashed line, and the entry aperture 49b touches internally the rectangular phosphor layer 42. In other words, the upper surface of the phosphor layer 42 is larger than the entry aperture 49b of the reflection frame 49.

FIGS. 15A to 15D are cross-sectional views depicting production steps of the light emitting apparatus 40. FIGS. 16A to 16D are top views depicting the production steps of the light emitting apparatus 40, and correspond respectively to FIGS. 15A to 15D.

Figure 15A:
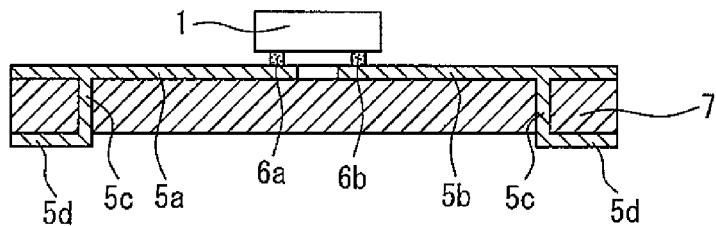
FIGS. 15A to 15D are cross-sectional views depicting production steps of the light emitting apparatus 40.
Figure 15B:
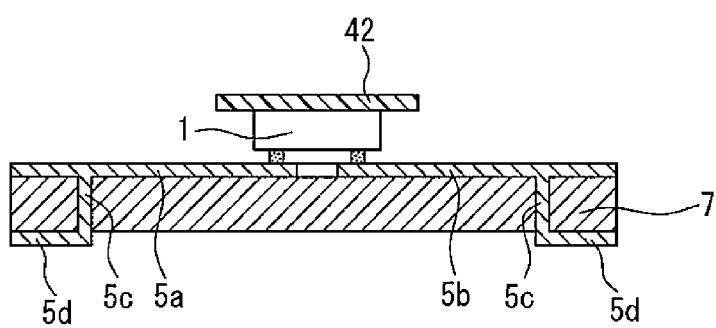
Figure 15C:
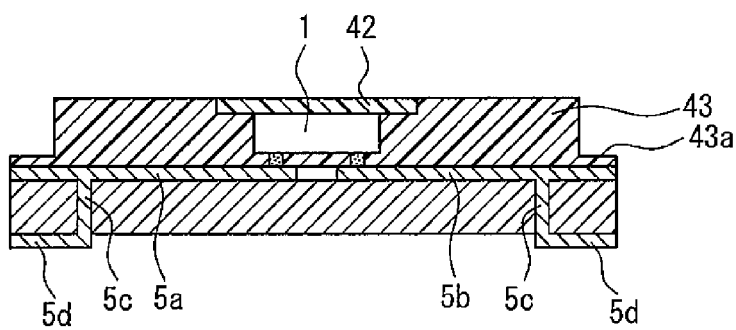
Figure 15D:
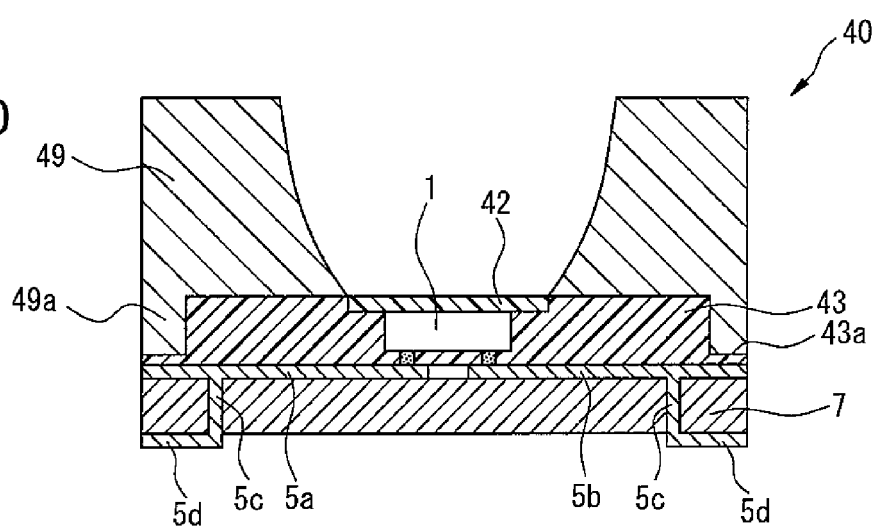
Figure 16A:
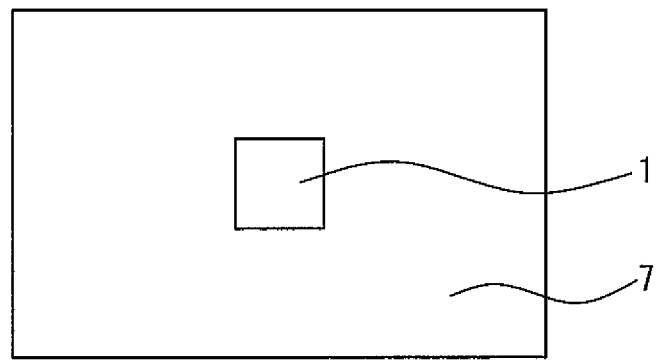
FIGS. 16A to 16D are top views depicting the production steps of the light emitting apparatus 40.
Figure 16B:
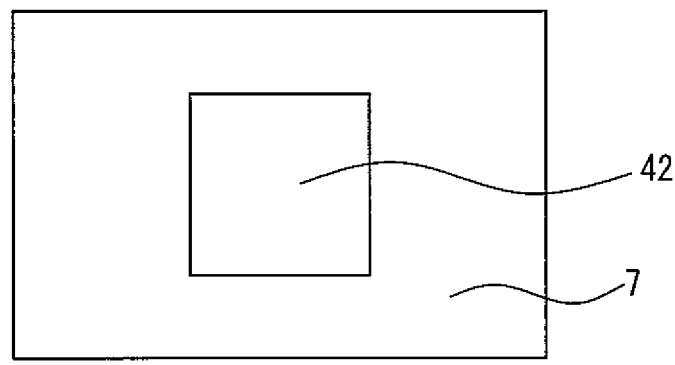
Figure 16C:
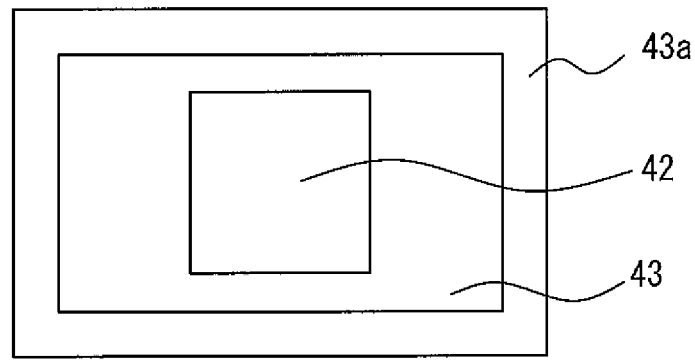
Figure 16D:
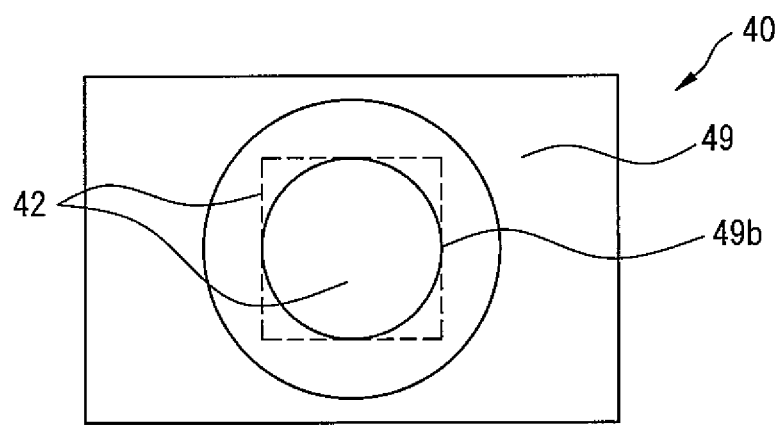

FIGS. 15A and 16A depict an LED mounting step, in which the LED device 1 is flip-chip mounted on the wiring electrodes 5a and 5b of the circuit substrate 7 by the electroconductive components 6a and 6b. FIGS. 15B and 16B depict a phosphor-layer bonding step, in which the phosphor layer 42 is fixed on the LED device 1 by applying a transparent adhesive to the upper surface of the LED device 1 and pressing the phosphor layer 42 thereon. FIGS. 15C and 16C depict a resin filling step, in which the side surface of the LED device 1 and the side surface of the phosphor layer 42 are sealed by filling the reflective resin 43 using an injection mold or the like. On this occasion, the recessed step 43a is formed along the side circumference of the reflective resin 43. FIGS. 15D and 16D depict a reflection-frame mounting step, in which the reflection frame 49 is fixed to the reflective resin 43 by engaging the protruded step 49a formed along the side circumference of the reflection frame 49 with the recessed step 43a formed along the side circumference of the reflective resin 43. Through the above steps, the light emitting apparatus 40 is completed.

In the light emitting apparatus 40 as depicted in FIG. 16D, the corners of the rectangular phosphor layer 42 are covered by the reflection frame 49, and the phosphor layer 42 is visible in a round form through the entry aperture 49b of the reflection frame 49.

Figure 17:
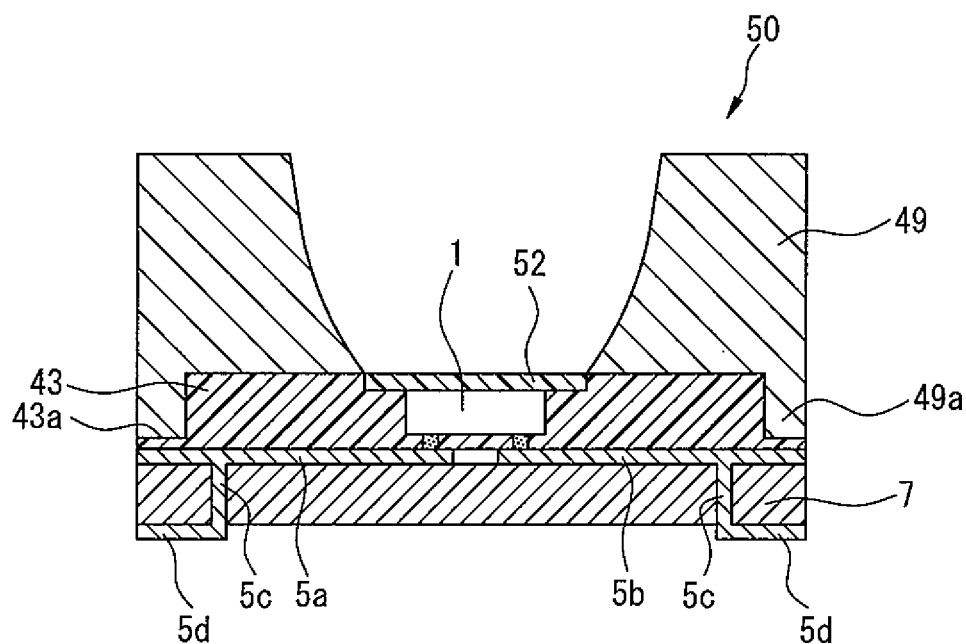
FIGS. 17 and 18 are respectively a cross-sectional view and a top view of a light emitting apparatus 50.
Figure 18:
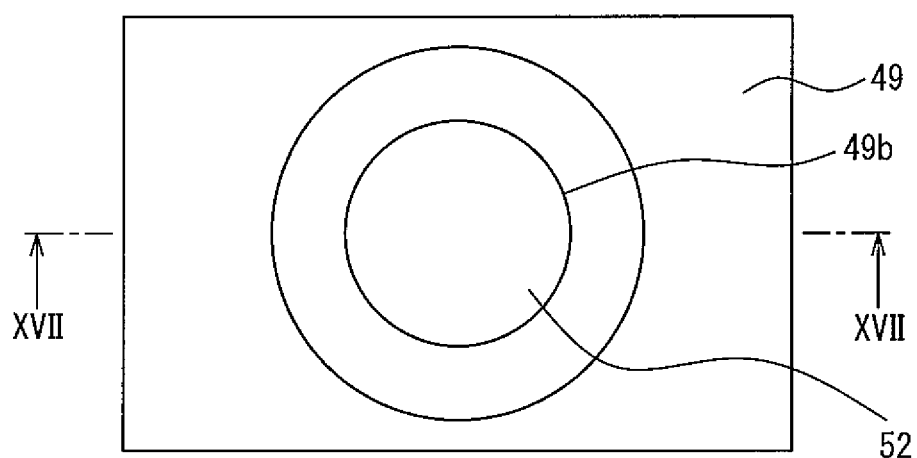

FIGS. 17 and 18 are respectively a cross-sectional view and a top view of a light emitting apparatus 50. FIG. 17 depicts a cross-section along the line XVII-XVII in FIG. 18. The basic constitution of the light emitting apparatus 50 is the same as the light emitting apparatus 40 depicted in FIGS. 13 and 14. Also in the light emitting apparatus 50, the reflection frame 49 and the reflective resin 43 are fixed together by engaging the protruded step 49a with the recessed step 43a. However, differently from the light emitting apparatus 40, the light emitting apparatus 50 has a round (disk-shaped) phosphor layer 52 placed on the light emitting surface of the LED device 1, and the shape and size of the upper surface of the phosphor layer 52 are identical with the shape and size of the entry aperture 49b of the reflection frame 49.

Figure 19A:
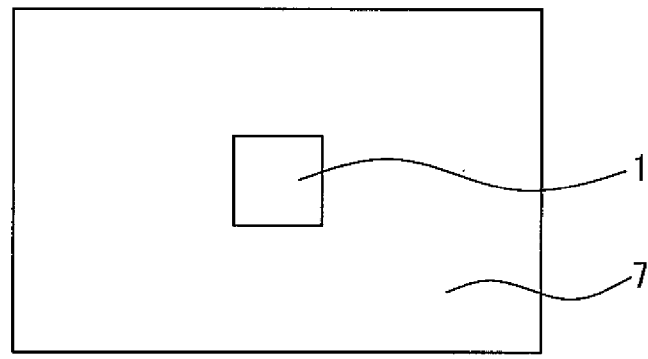
FIGS. 19A to 19D are top views depicting production steps of the light emitting apparatus 50.
Figure 19B:
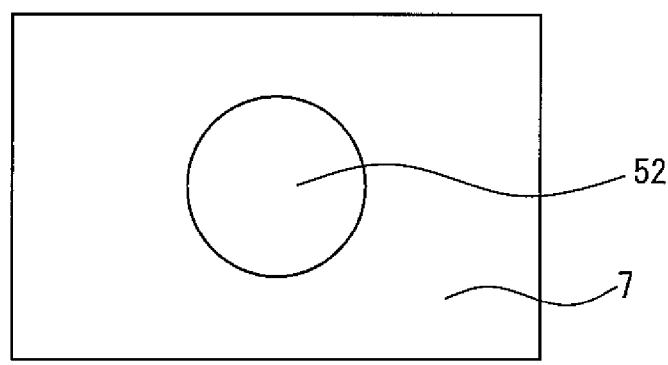
Figure 19C:
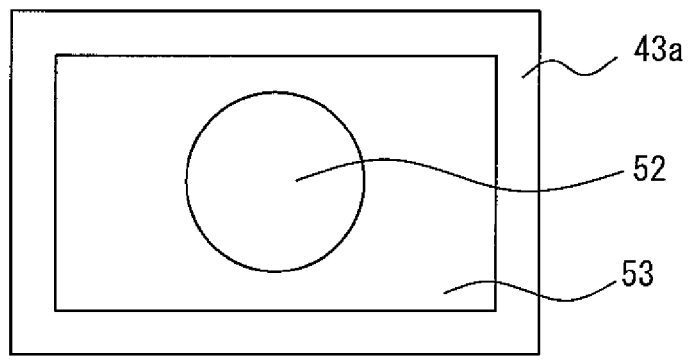
Figure 19D:
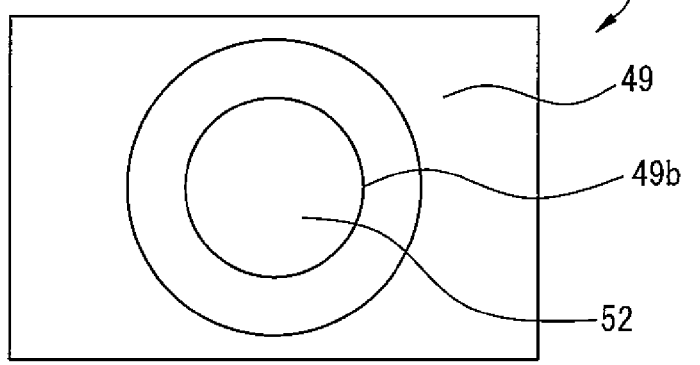

FIGS. 19A to 19D are top views depicting production steps of the light emitting apparatus 50. The cross-sectional views depicting the production steps of the light emitting apparatus 50 are the same as the cross-sectional views in FIGS. 15A to 15D depicting the production steps of the light emitting apparatus 40. For the light emitting apparatus 50, the round phosphor layer 52 is bonded to the upper surface of the LED device 1 in the phosphor bonding step depicted in FIG. 19B. Since the shape and size of the phosphor layer 52 are nearly the same as those of the round entry aperture 49b of the reflection frame 49 as depicted in FIG. 19D, the entire phosphor layer 52 is exposed.

When the shapes and sizes of the entry aperture 49b of the reflection frame 49 and the phosphor layer 52 are made identical, the entire phosphor layer 52 is exposed from the entry aperture 49b and the entire radiated light from the phosphor layer 52 can be utilized effectively. Consequently, the light emitting apparatus 50 can emit a larger amount of light.

Figure 20:
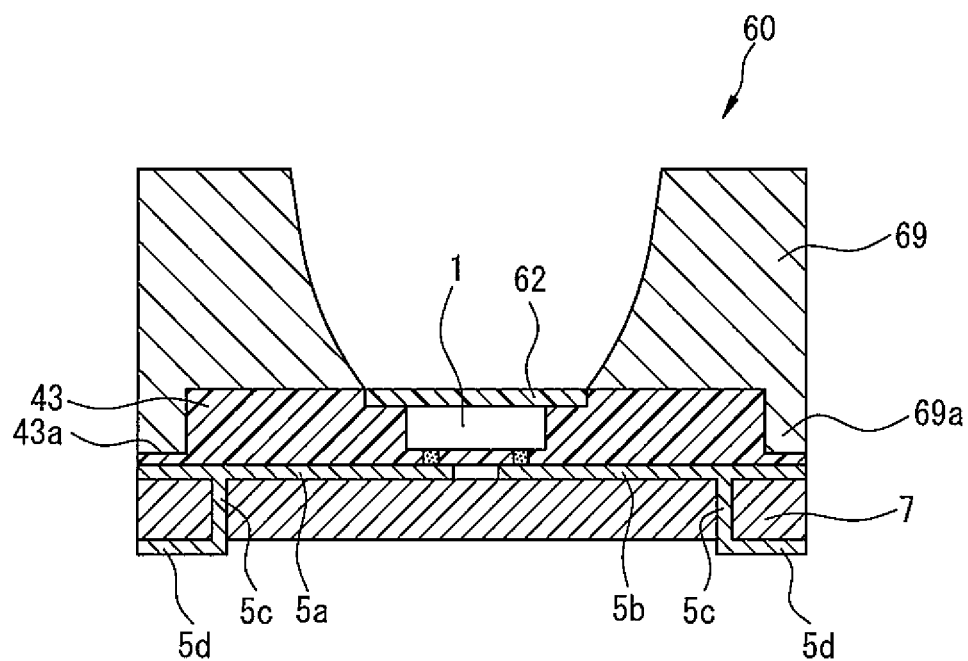
FIGS. 20 and 21 are respectively a cross-sectional view and a top view of a light emitting apparatus 60.
Figure 21:
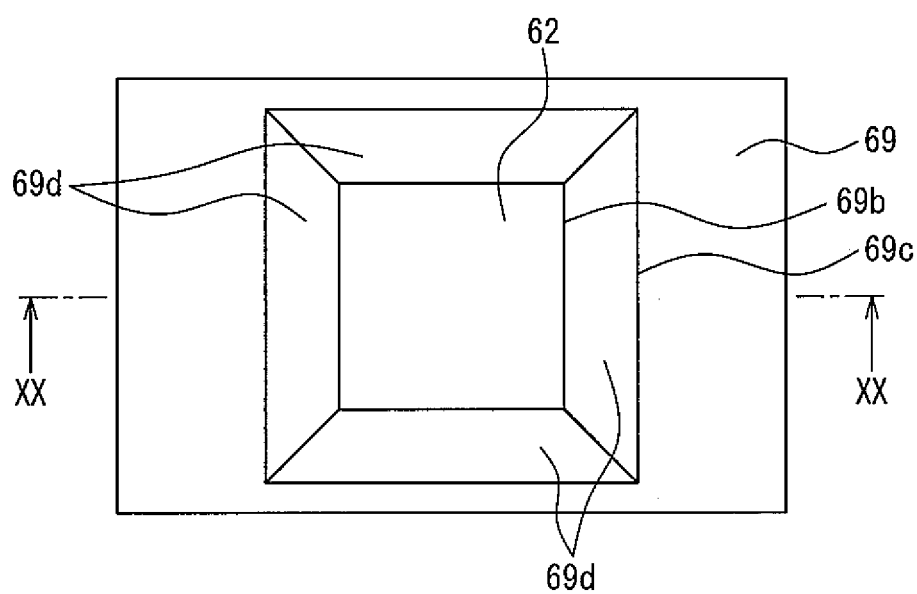

FIGS. 20 and 21 are respectively a cross-sectional view and a top view of a light emitting apparatus 60. FIG. 20 depicts a cross-section along the line XX-XX in FIG. 21. The basic constitution of the light emitting apparatus 60 is the same as the light emitting apparatus 50 depicted in FIGS. 17 and 18. Also in the light emitting apparatus 60, a reflection frame 69 and the reflective resin 43 are fixed together by engaging a protruded step 69a formed along the side circumference of the reflection frame 69 with the recessed step 43a. In the light emitting apparatus 60, differently from the light emitting apparatus 50, the upper surface of a phosphor layer 62 and an entry aperture 69b of the reflection frame 69 of the light emitting apparatus 60 are both rectangular and reflection surfaces 69d curved and inclined in four directions are formed in the reflection frame 69, while in the light emitting apparatus 50 the upper surface of the phosphor layer 52 and the entry aperture 49b of the reflection frame 49 are both round. Further, the light emitting apparatus 60 has an exit aperture 69c which is also rectangular.

Figure 22A:
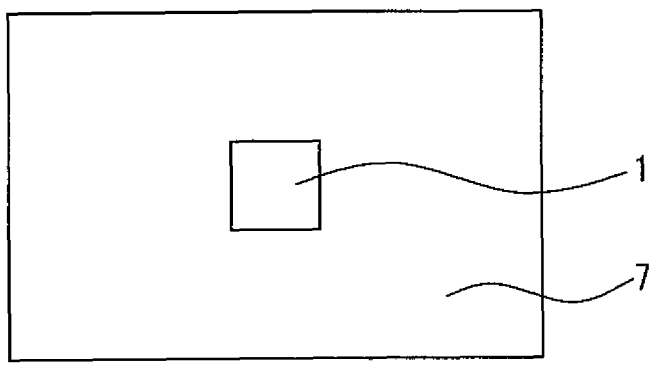
FIGS. 22A to 22D are top views depicting production steps of the light emitting apparatus 60.
Figure 22B:
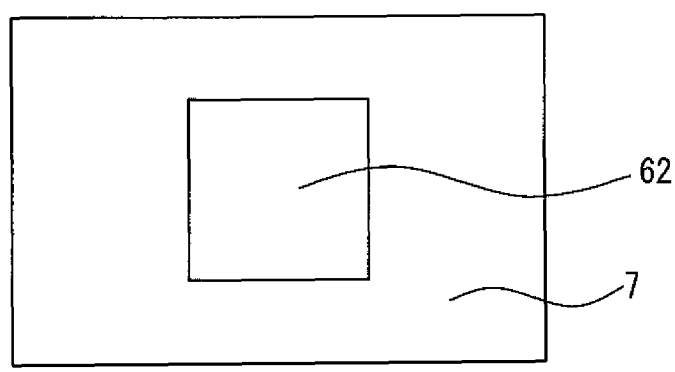
Figure 22C:
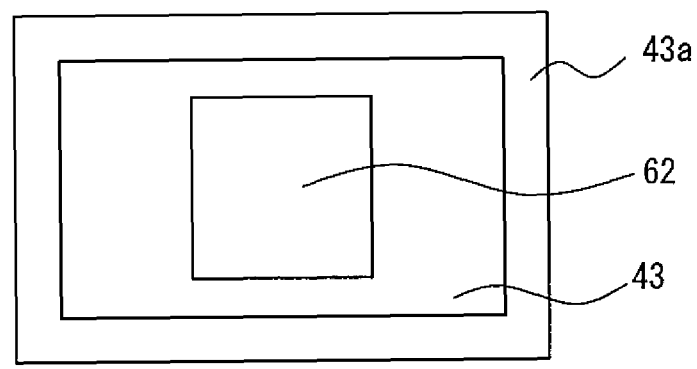
Figure 22D:
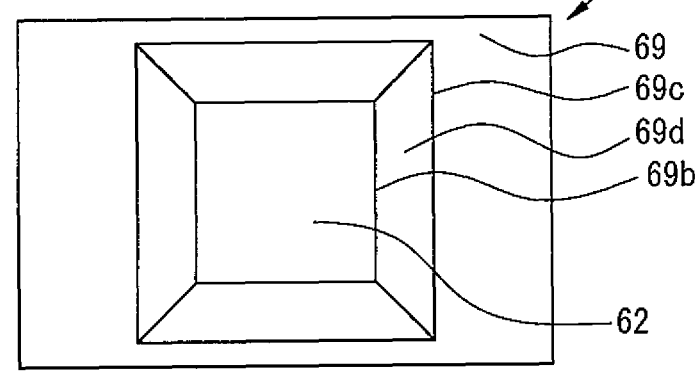

FIGS. 22A to 22D are top views depicting production steps of the light emitting apparatus 60. The cross-sectional views depicting the production steps of the light emitting apparatus 60 are the same as the cross-sectional views in FIGS. 15A to 15D depicting the production steps of the light emitting apparatus 40. For the light emitting apparatus 60, the rectangular phosphor layer 62 is bonded to the upper surface of the LED device 1 in the phosphor bonding step depicted in FIG. 22B. Since the shape and size of the phosphor layer 62 is nearly the same as those of the rectangular entry aperture 69b of the reflection frame 69 as depicted in FIG. 22D, the entire phosphor layer 62 is exposed.

When the shapes and sizes of the entry aperture 69b of the reflection frame 69 and the phosphor layer 62 are made identical in a rectangular form, the entire phosphor layer 62 in a rectangular form is exposed from the entry aperture 69b and the entire radiated light from the phosphor layer 62 can be utilized effectively. Consequently, the light emitting apparatus 60 can further increase the amount of light.

Figure 23:
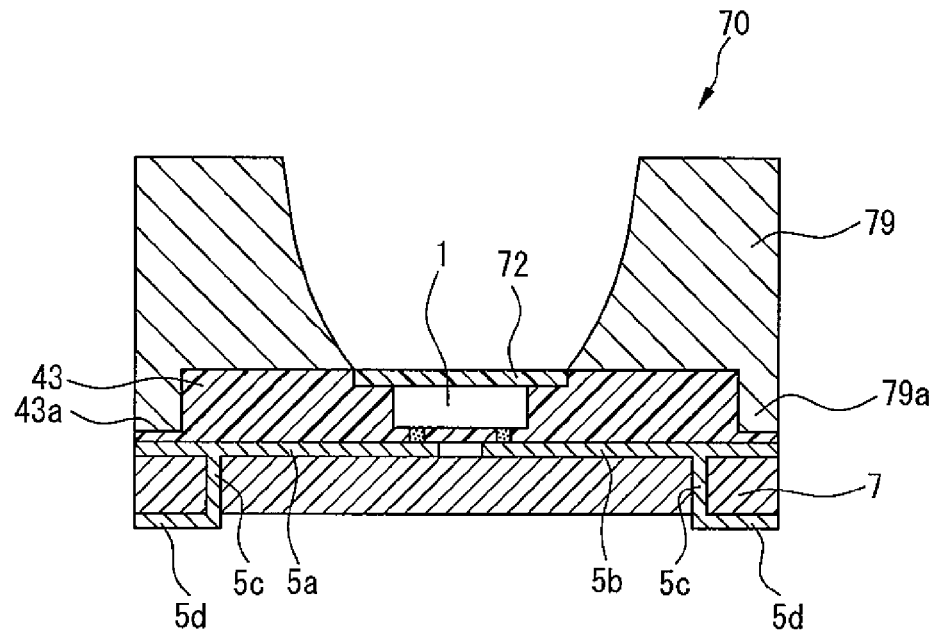
FIGS. 23 and 24 are respectively a cross-sectional view and a top view of a light emitting apparatus 70.
Figure 24:
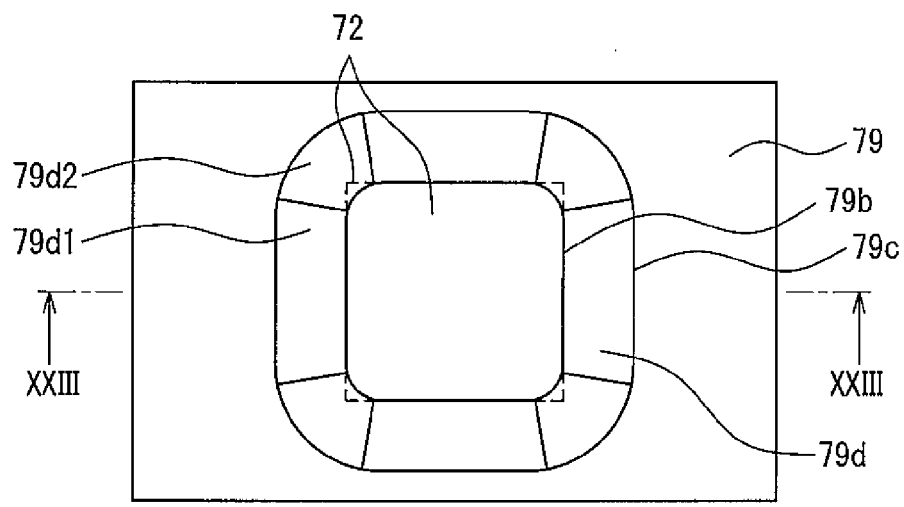

FIGS. 23 and 24 are respectively a cross-sectional view and a top view of a light emitting apparatus 70. FIG. 23 depicts a cross-section along the line XXIII-XXIII in FIG. 24. The basic constitution of the light emitting apparatus 70 is the same as the light emitting apparatus 60 depicted in FIGS. 20 and 21. Also in the light emitting apparatus 70, a reflection frame 79 and the reflective resin 43 are fixed together by engaging a protruded step 79a formed along the side circumference of the reflection frame 79 with the recessed step 43a. Further, the light emitting apparatus 70 has a rectangular phosphor layer 72 which is the same as the phosphor layer 62 of the light emitting apparatus 60. However, the reflection frame 79 of the light emitting apparatus 70 has a rectangular entry aperture 79b with rounded corners and curved and inclined reflection surfaces 79d in totally eight directions. The reflection surfaces 79d are constituted with reflection surfaces 79d1 corresponding to side surfaces in four directions, and reflection surfaces 79d2 corresponding to the corners in four directions. Further, in the light emitting apparatus 70, differently from the light emitting apparatus 60, the corners of the phosphor layer 72 are slightly covered by the entry aperture 79b of the reflection frame 79.

By forming the entry aperture 79b of the reflection frame 79 in a nearly rectangular shape and the reflection surfaces 79d in eight bevels, the amount of light can be increased and at the same time the condensing property of the emitted light can be enhanced.

Figure 25A:
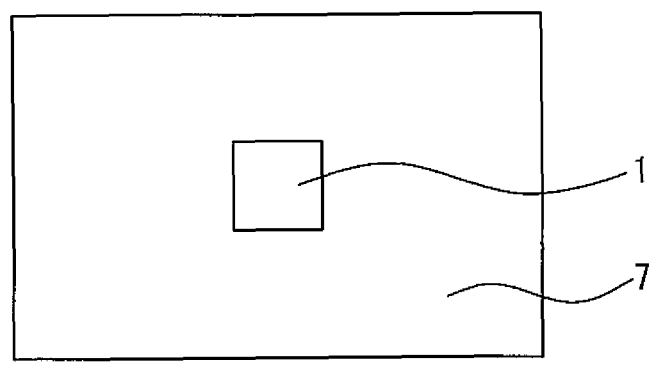
Figure 22B:
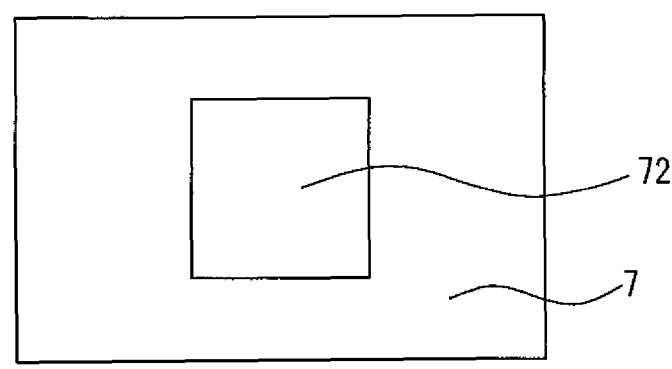
Figure 25C:
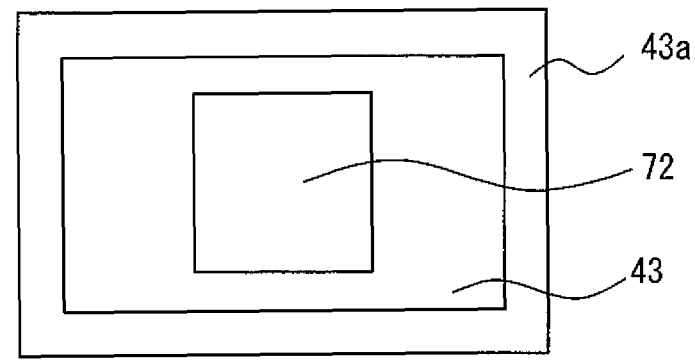

FIGS. 25A to 25D are top views depicting production steps of the light emitting apparatus 70. The cross-sectional views depicting the production steps of the light emitting apparatus 70 are the same as the cross-sectional views in FIGS. 15A to 15D depicting the production steps of the light emitting apparatus 40. Since the steps depicted in FIGS. 25A to 25C are the same as in the case of the light emitting apparatus 40, further descriptions will be omitted.

Figure 25D:
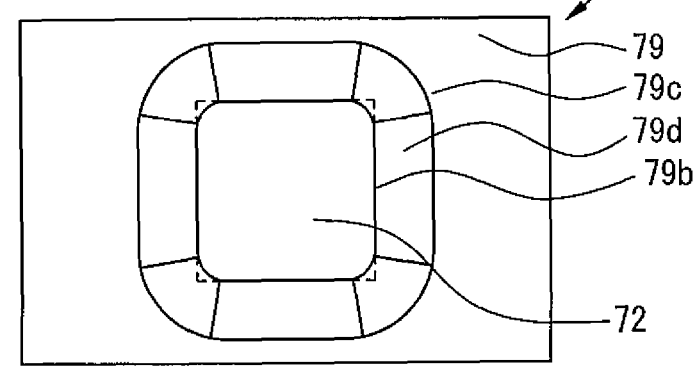

When the reflection frame 79 is fixed in the reflection-frame mounting step as depicted in FIG. 25D, although the corners of the phosphor layer 72 are slightly hidden by the octagonal entry aperture 79b with beveled corners, substantially all the phosphor layer 72 is exposed. When substantially all the phosphor layer 72 is exposed out of the entry aperture 79b of the reflection frame 79, and the reflection surfaces 79d of the reflection frame 79 are beveled octagonally, all the radiated light from the phosphor layer 72 can be utilized effectively, and also the condensing property of the emitted light can be enhanced.

Figure 26:
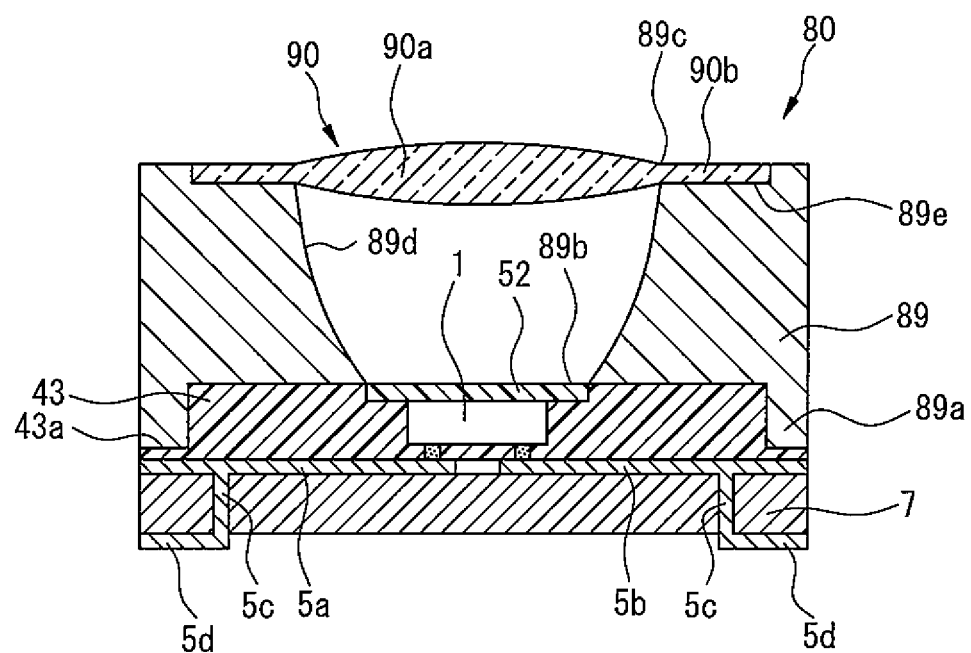
FIGS. 26 and 27 are respectively a cross-sectional view and a top view of a light emitting apparatus 80.
Figure 27:
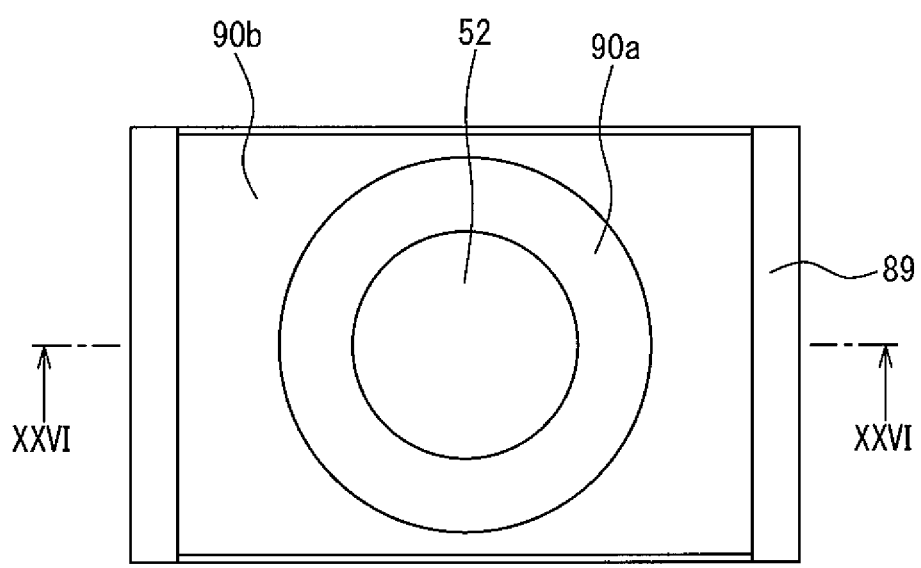

FIGS. 26 and 27 are respectively a cross-sectional view and a top view of a light emitting apparatus 80. FIG. 26 depicts a cross-section along the line XXVI-XXVI in FIG. 27. The basic constitution of the light emitting apparatus 80 is the same as the light emitting apparatus 50 depicted in FIGS. 17 and 18. Also in the light emitting apparatus 80, a reflection frame 89 and the reflective resin 43 are fixed together by engaging a protruded step 89a formed along the side circumference of the reflection frame 89 with the recessed step 43a. However, differently from the light emitting apparatus 50, the light emitting apparatus 80 is provided with a lens 90 at a round exit aperture 89c provided at an upper part of the reflection frame 89.

The lens 90 includes a central lens portion 90a and around the same a lens rim portion 90b. The lens portion 90a is a round convex lens, and the outer circumference of the lens rim portion 90b is rectangular. In the light emitting apparatus 80, a mounting recessed portion 89e is formed around the exit aperture 89c of the reflection frame 89, and the lens rim portion 90b of the lens 90 is inserted into the mounting recessed portion 89e.

In the light emitting apparatus 80, by forming the exit aperture 89c of the reflection frame 89 in a round form, the fitness of the round lens portion 90a can be enhanced. Further, by forming the mounting recessed portion 89e around the exit aperture 89c, the lens 90 can be easily mounted. Further, by collecting the light emitted from the LED device 1 and entered the entry aperture 89b with a reflection surface 89d of the reflection frame 89, and condensing the same by the lens 90, the condensing property of light can be enhanced.

As described above, in the light emitting apparatus 40 to 80, a light emitting portion free from lateral light leakage can be configured by sealing the side surfaces of the phosphor layers 42, 52, 62 and 72 and the LED device 1 with the reflective resin 43. Further, the light emitting apparatus 40 to 80 are assembled by fitting the recessed step 43a and the protruded steps 49a, 69a, 79a, and 89a formed respectively at the side circumferences of the reflective resin 43 and the reflection frames 49, 69, 79 and 89, and this allows easy production. Further, when reflection frames having various shapes and characteristics have been prepared with a protruded step of a common shape, and interchanged optionally, there can be a broad variety of functions and designs.

The preceding description is merely illustrative and describes exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, the invention is not limited to the particular embodiment disclosed as the best mode for carrying out this invention, but the invention includes all embodiments falling within the scope of the claims. The invention may be practiced otherwise than is specifically explained and illustrated without departing from its spirit or scope.

What is claimed is:

1. A light emitting apparatus comprising:
an LED device which is flip-chip mounted on a substrate;
a phosphor layer placed on a light emitting surface of the LED device;
a reflective resin having a recessed portion formed on the upper surface thereof, the reflective resin covering the side surface of the LED device and the side surface of the phosphor layer;
a reflection frame having a protruded portion formed on the lower surface thereof, the reflection frame being fixed on or above the phosphor layer and the reflective resin by engaging the protruded portion with the recessed portion of the reflective resin; and
a diffusing resin layer being layered on the upper surfaces of the phosphor layer and the reflective resin, the diffusing resin layer having a through-hole at a position corresponding to the recessed portion of the reflective resin,
wherein the protruded portion of the reflection frame passes through the through-hole of the diffusing resin layer and engages with the recessed portion of the reflective resin.

2. The light emitting apparatus according to claim 1, wherein the reflection frame comprises a round opening provided above the phosphor layer and a curved reflection surface provided in the opening.

3. The light emitting apparatus according to claim 1, wherein
the reflective resin has a recessed step formed at the side circumference thereof as the recessed portion, and
the reflection frame has a protruded step formed at the side circumference thereof as the protruded portion.

4. The light emitting apparatus according to claim 3, wherein
the reflection frame has an entry aperture into which light from the LED device enters through the phosphor layer, and
the upper surface of the phosphor layer is larger than the entry aperture of the reflection frame.

5. The light emitting apparatus according to claim 4, wherein
the entry aperture of the reflection frame is round, and
the phosphor layer has a rectangular upper surface and corners covered by the reflection frame.

6. The light emitting apparatus according to claim 4, wherein
the entry aperture of the reflection frame is rectangular with rounded corners, and
the phosphor layer has a rectangular upper surface and corners covered by the reflection frame.

7. The light emitting apparatus according to claim 3, wherein
the reflection frame has an entry aperture into which light from the LED device enters through the phosphor layer, and
the phosphor layer has an upper surface whose shape and size are nearly identical with the shape and size of the entry aperture of the reflection frame.

8. The light emitting apparatus according to claim 7, wherein the upper surface of the phosphor layer and the entry aperture of the reflection frame are both round.

9. The light emitting apparatus according to claim 7, wherein the upper surface of the phosphor layer and the entry aperture of the reflection frame are both rectangular.

10. The light emitting apparatus according to claim 1, wherein
the reflection frame has an entry aperture into which light from the LED device enters through the phosphor layer, and an exit aperture at a position opposing to the entry aperture, and
the light emitting apparatus further comprises a lens placed so as to cover the exit aperture of the reflection frame.

* * * * *